United States Patent
Choi

(10) Patent No.: US 10,465,280 B1
(45) Date of Patent: Nov. 5, 2019

(54) METHOD OF ETCHING PVD-COATED STAINLESS STEEL

(71) Applicants: Hyundai Motor Company, Seoul (KR); Kia Motors Corporation, Seoul (KR)

(72) Inventor: Dong Jae Choi, Seoul (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 16/109,576

(22) Filed: Aug. 22, 2018

(30) Foreign Application Priority Data

Apr. 25, 2018 (KR) .................. 10-2018-0048076

(51) Int. Cl.
| | | |
|---|---|---|
| *C23C 14/02* | (2006.01) | |
| *C23C 14/58* | (2006.01) | |
| *C23C 14/06* | (2006.01) | |
| *C23C 14/34* | (2006.01) | |

(52) U.S. Cl.
CPC ........ *C23C 14/5873* (2013.01); *C23C 14/028* (2013.01); *C23C 14/0635* (2013.01); *C23C 14/0641* (2013.01); *C23C 14/34* (2013.01)

(58) Field of Classification Search
CPC . C23C 14/5873; C23C 14/34; C23C 14/0641; C23C 14/028; C23C 14/0635

USPC ............... 216/41, 46, 77, 78, 100, 102, 106
See application file for complete search history.

(56) References Cited

U.S. PATENT DOCUMENTS

| | | | | |
|---|---|---|---|---|
| 4,267,221 | A * | 5/1981 | Ishikawa .................. | E04C 2/30 428/121 |
| 4,396,448 | A * | 8/1983 | Ohta ....................... | B32B 27/04 156/219 |
| 8,395,059 | B2 * | 3/2013 | Miyazaki ............. | H05K 9/0096 156/60 |
| 2003/0180554 | A1 * | 9/2003 | Inokuti ................ | C21D 8/1288 428/472 |

FOREIGN PATENT DOCUMENTS

| | | |
|---|---|---|
| KR | 10-1387638 B1 | 4/2014 |
| KR | 10-2017-0065050 A | 6/2017 |

* cited by examiner

*Primary Examiner* — Lan Vinh
(74) *Attorney, Agent, or Firm* — Morgan, Lewis & Bockius LLP

(57) ABSTRACT

A method of etching PVD-coated stainless steel, may include machining to form irregularities on a surface of a steel member; coating the steel member by providing a coating layer on crests of the irregularities but not on throughs, the coating layer imparting color and texture to the steel member; masking in which the surface of the steel member is partially provided with a masking layer such that the surface of the steel member includes a masking area and an exposed area; and etching the coating layer provided on the exposed area to remove the coating layer.

16 Claims, 7 Drawing Sheets

METHOD OF ETCHING PVD-COATED STAINLESS STEEL

CROSS REFERENCE TO RELATED APPLICATION

The present application claims priority to Korean Patent Application No. 10-2018-0048076, filed Apr. 25, 2018, the entire contents of which is incorporated herein for all purposes by this reference.

BACKGROUND OF THE INVENTION

Field of the Invention

The present invention relates generally to a method of etching PVD-coated stainless steel. More particularly, the present invention relates to a method of etching PVD-coated stainless steel, the method configured for etching a surface of a stainless steel member coated by physical vapor deposition (PVD).

Description of Related Art

To bolster merchantability of internal and external stainless steel parts, it is possible to impart a decorative property by machining the surface thereof by a chemical or mechanical method.

As a kind of such a machining method, a predetermined color may be provided to a component such that a surface of a hair-line-processed component is partially etched to imprint a logo or a product name or by physical vapor deposition (PVD) coating in which titanium carbide (TiC) is deposited.

However, since PVD coating is expensive because of process characteristics thereof and can only be applied to finished and etched components, there is a limit to freely selecting designs and colors. When PVD coating is performed before the etching, a coating film acts as a protective film protecting a base material. Therefore, it is difficult to perform etching smoothly, and further machining is required for etching, which complicates the process and raises the machining cost.

Accordingly, there is a demand for a novel method of manufacturing stainless steel component, the method configured for freely selecting a design and color by performing PVD coating beforehand, and thereafter performing etching, improving the merchantability of the components.

The information disclosed in this Background of the Invention section is only for enhancement of understanding of the general background of the invention and may not be taken as an acknowledgement or any form of suggestion that this information forms the prior art already known to a person skilled in the art.

BRIEF SUMMARY

Various aspects of the present invention are directed to providing a method of etching PVD-coated stainless steel, the method configured for performing etching after physical vapor deposition (PVD) to freely select design, color, texture.

In various aspects of the present invention, there is provided a method of etching PVD-coated stainless steel according to an exemplary embodiment of the present invention, the method including: machining to form irregularities on a surface of a steel member; coating the steel member by providing a coating layer on crests of the irregularities but not on throughs, the coating layer imparting color and texture to the steel member; masking in which the surface of the steel member is partially provided with a masking layer such that the surface of the steel member includes a masking area and an exposed area; and etching the coating layer provided on the exposed area to remove the coating layer.

The coating layer provided at the coating may be 0.05 μm to 0.15 μm in thickness.

At the coating, the crests where electric charges are concentrated on the irregularities may be deposited with the coating layer by use of physical vapor deposition (PVD).

At the masking, a photosensitive film may be attached on the surface of the steel member and a predetermined area of the photosensitive film is irradiated with ultraviolet light to remove the photosensitive film at a position corresponding to the exposed area.

At the etching, etching may be started from the throughs of the irregularities to the crests of the irregularities to corrode such that the coating layer provided on the crests of the irregularities is removed.

At the machining, the irregularities may be formed on the surface of the steel member, the irregularities ranging from 5 μm to 100 μm in depth and ranging from 5 to 100 μm in width.

After the etching, the surface of the steel member may be configured with a hole in which a depth of the hole is equal to or greater than 100 μm.

At the masking, a plurality of holes configured in a same size may be disposed in a predetermined interval to give the exposed area a predetermined shape.

At the masking, the plurality of holes may be configured in a circle having a diameter of 0.1 mm to 0.3 mm.

At the masking, a hole may be configured to have a predetermined area in a continuous manner to give the exposed area a predetermined shape.

After the etching, the steel member may be configured with a through-hole penetrating through the steel member in the thickness direction thereof.

A method of etching PVD-coated stainless steel according to an exemplary embodiment of the present invention has the following effects.

Since etching is performed after PVD, design and color of a coated surface may be expressed freely.

Furthermore, etching may be performed on a PVD-coated surface directly whereby process may be simplified.

Furthermore, light, shadow, and texture of an etched area may be diversified by fine pattern etching.

The methods and apparatuses of the present invention have other features and advantages which will be apparent from or are set forth in more detail in the accompanying drawings, which are incorporated herein, and the following Detailed Description, which together serve to explain certain principles of the present invention.

Figure 1:
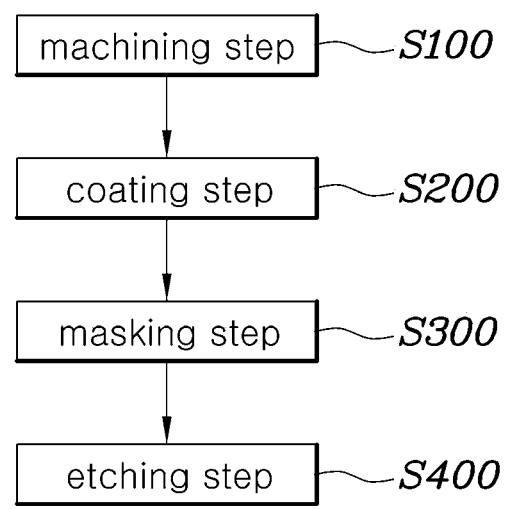
FIG. 1 is a flowchart of a method of etching PVD-coated stainless steel according to an exemplary embodiment of the present invention.

It may be understood that the appended drawings are not necessarily to scale, presenting a somewhat simplified representation of various features illustrative of the basic principles of the present invention. The specific design features of the present invention as disclosed herein, including, for example, specific dimensions, orientations, locations, and shapes will be determined in part by the particularly intended application and use environment.

In the figures, reference numbers refer to the same or equivalent parts of the present invention throughout the several figures of the drawing.

DETAILED DESCRIPTION

Reference will now be made in detail to various embodiments of the present invention(s), examples of which are illustrated in the accompanying drawings and described below. While the invention(s) will be described in conjunction with exemplary embodiments of the present invention, it will be understood that the present description is not intended to limit the invention(s) to those exemplary embodiments. On the other hand, the invention(s) is/are intended to cover not only the exemplary embodiments of the present invention, but also various alternatives, modifications, equivalents and other embodiments, which may be included within the spirit and scope of the invention as defined by the appended claims.

The terminology used herein is for the purpose of describing various exemplary embodiments only and is not intended to be limiting. As used herein, the singular forms "a", "an", and "the" are intended to include the plural forms as well, unless the context clearly indicates otherwise. It will be further understood that the terms "comprise", "include", "have", etc. When used in the exemplary embodiment, specify the presence of stated features, integers, steps, operations, elements, components, and/or combinations thereof but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present invention belongs. It will be further understood that terms, such as those defined in commonly used dictionaries, should be interpreted as having a meaning which is consistent with their meaning in the context of the relevant art and the present invention, and will not be interpreted in an idealized or overly formal sense unless expressly so defined herein.

Hereinafter, a method of etching PVD-coated stainless steel according to exemplary embodiments of the present invention will be described in detail with reference to the accompanying drawings.

Figure 2:
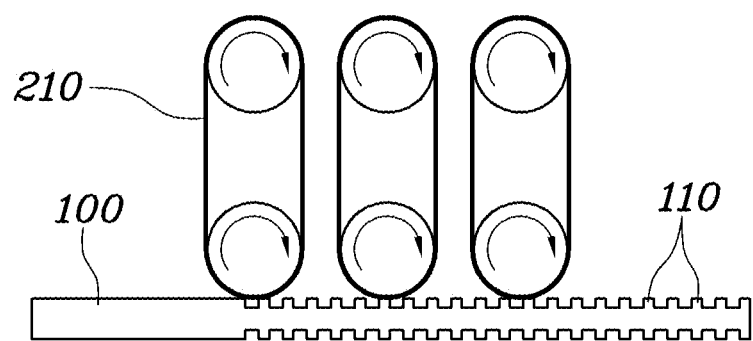
FIG. 2 and FIG. 3 depict diagrams showing a machining step of the present invention.
Figure 3:
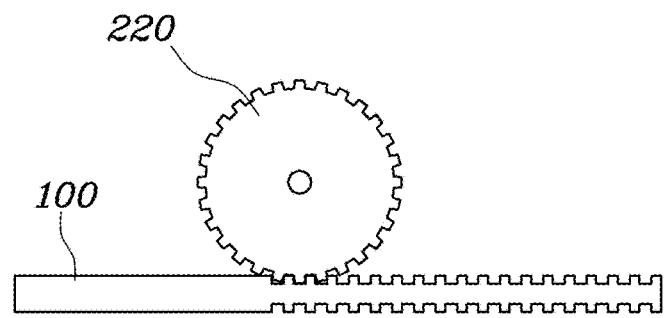
Figure 4:
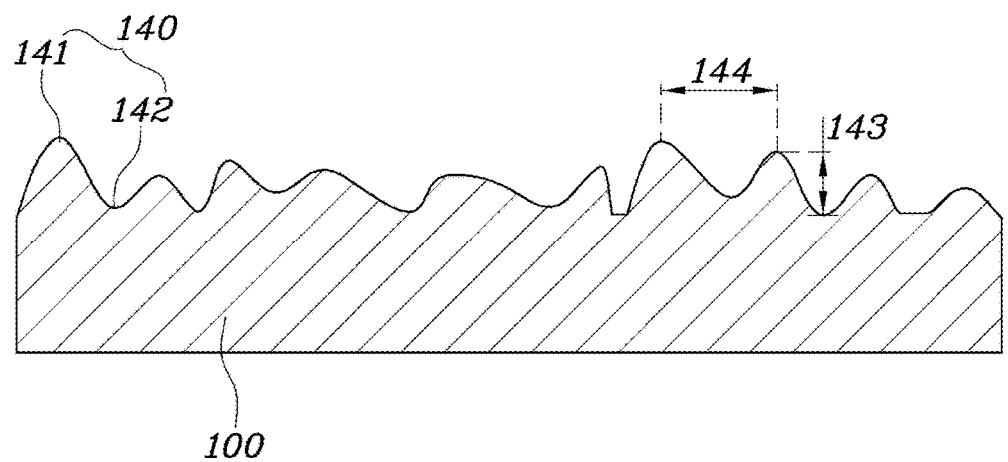
FIG. 4 is a diagram showing a surface of a steel member configured with irregularity after undergoing a machining step.
Figure 5:
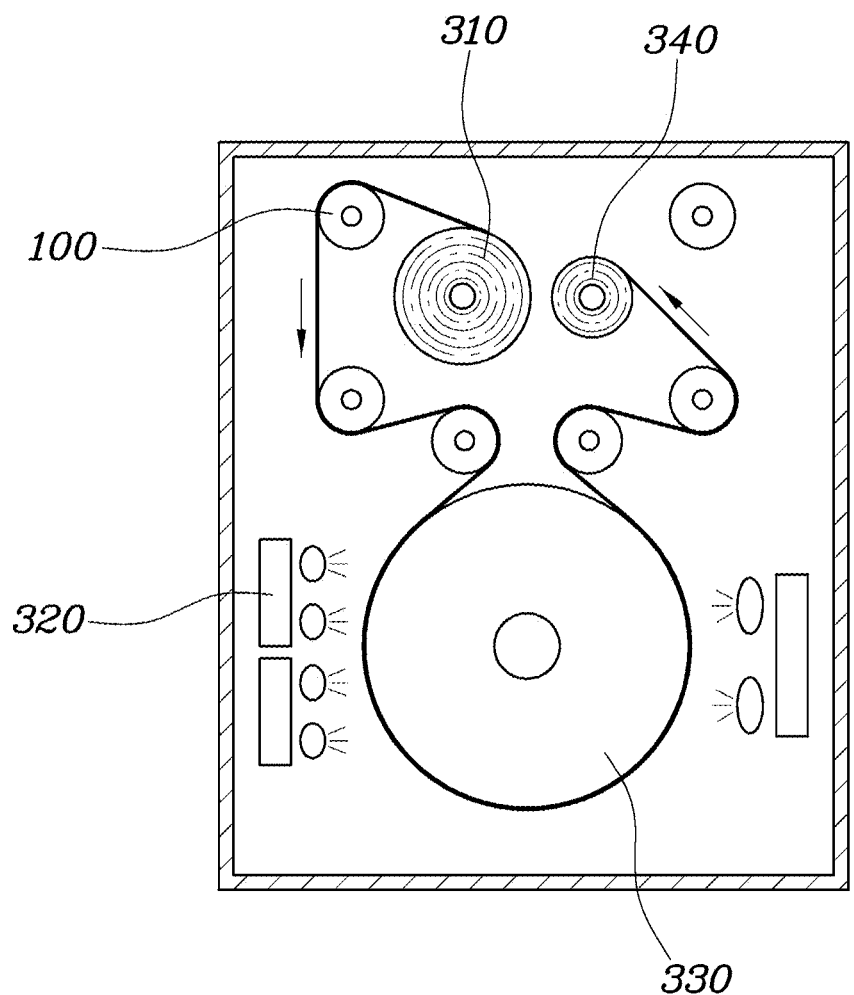
FIG. 5 is a diagram showing a coating step of the present invention.
Figure 6:
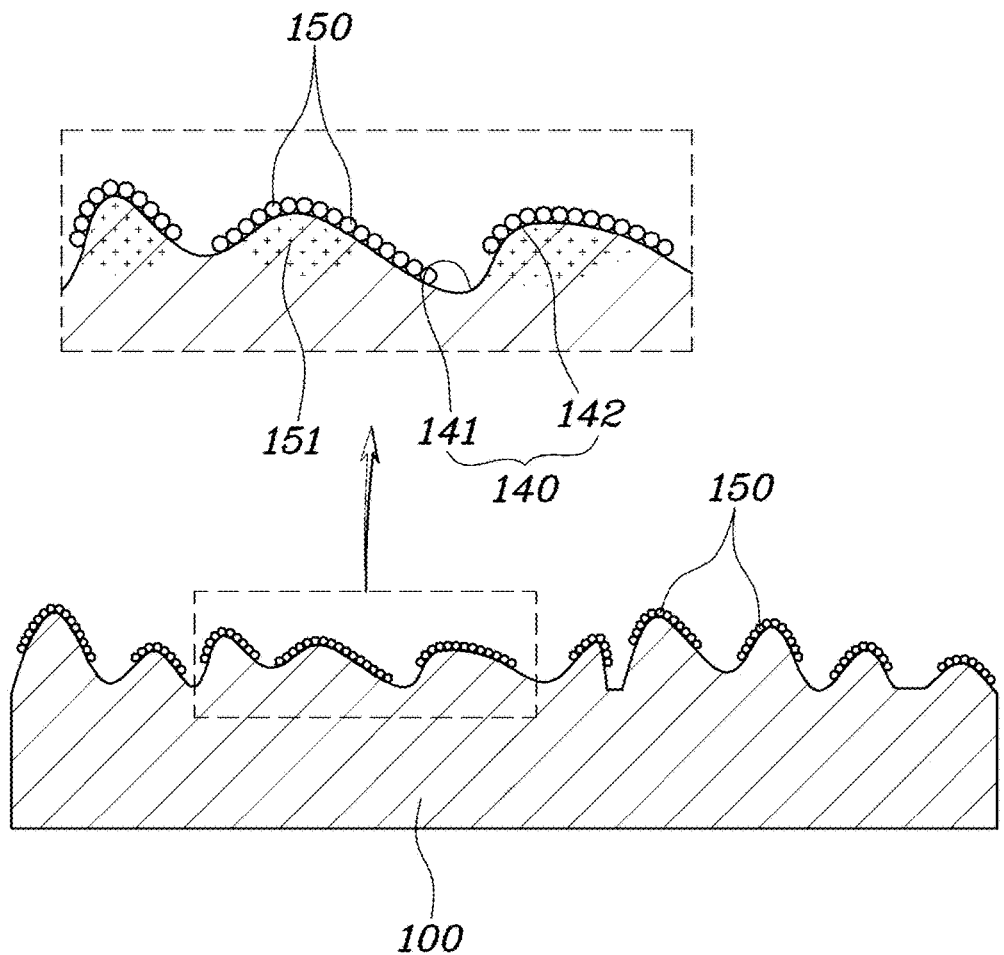
FIG. 6 is a diagram showing that a coating layer is formed on a surface of a steel member, which has undergone a coating step.
Figure 7:
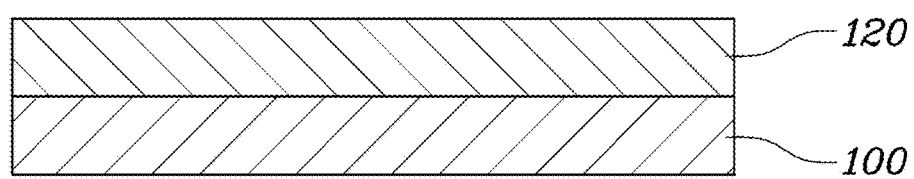
FIG. 7, FIG. 8 and FIG. 9 depict diagrams showing a masking step of the present invention.
Figure 8:
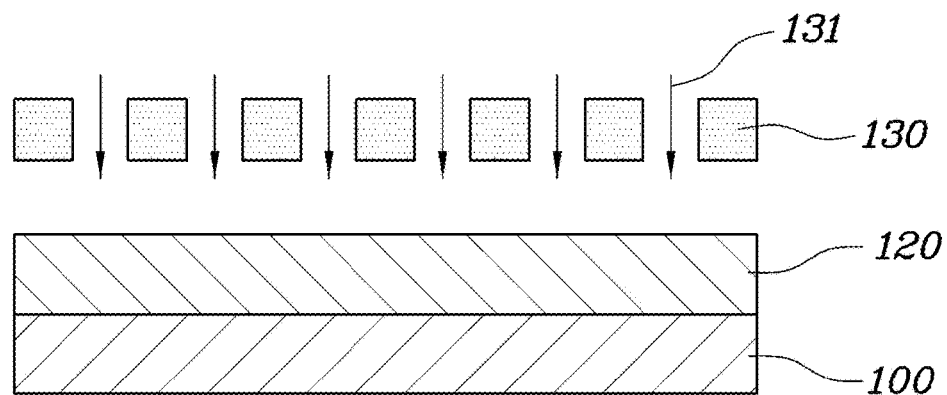
Figure 9:
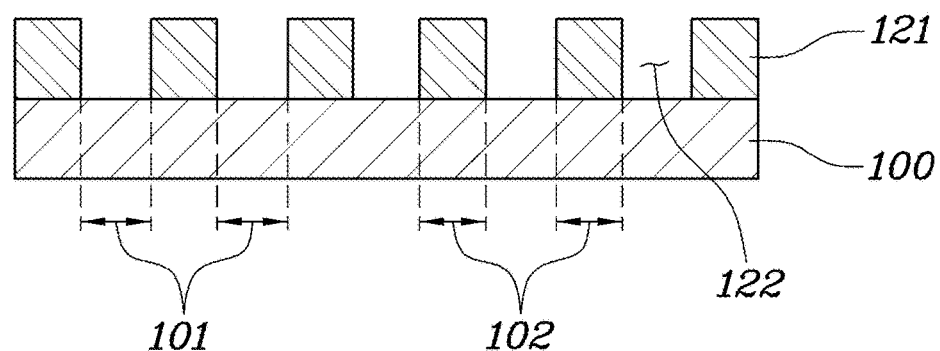
Figure 10:
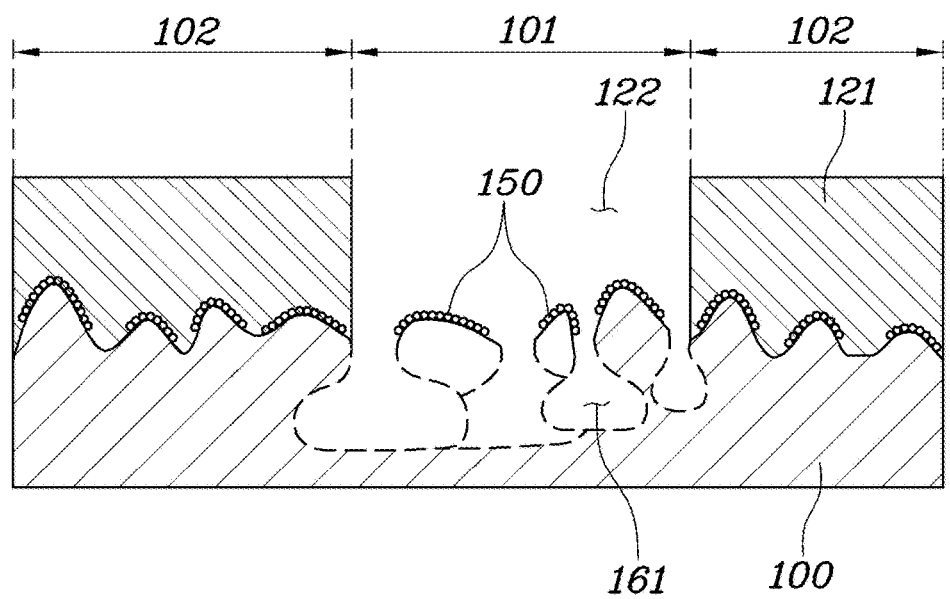
FIG. 10, FIG. 11 and FIG. 12 depict diagrams showing an etching step of the present invention.
Figure 11:
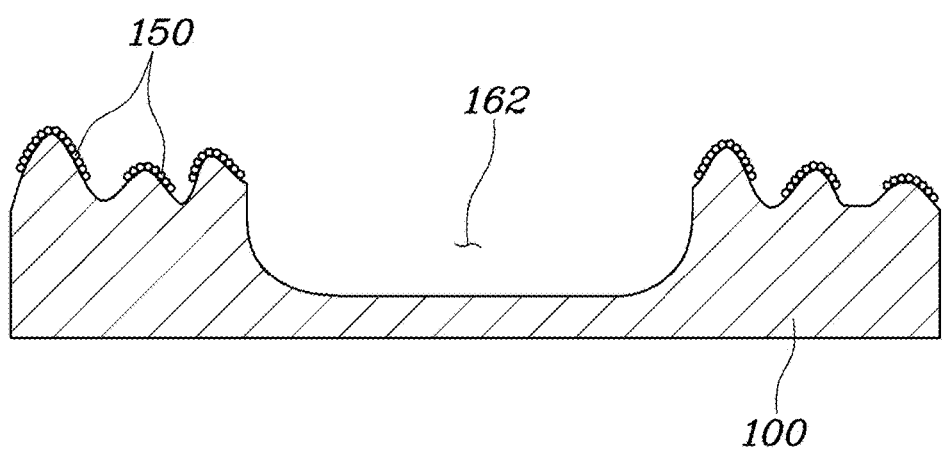
Figure 12:
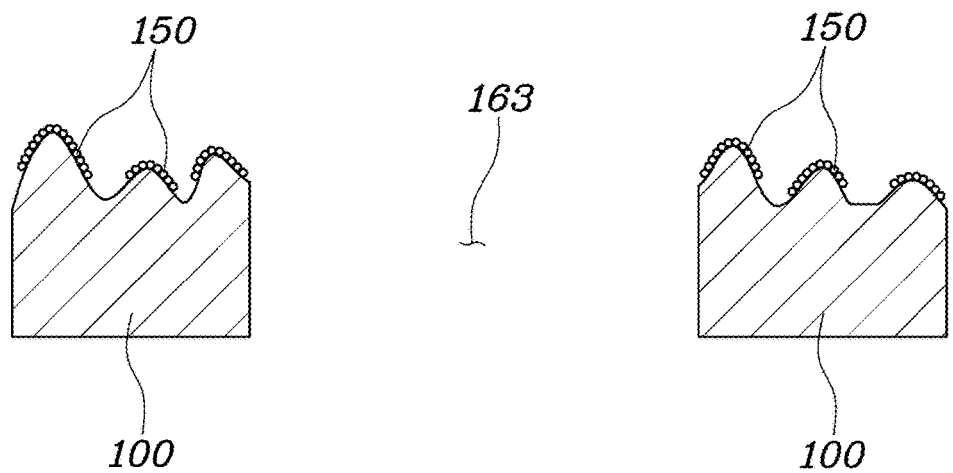
Figure 13:
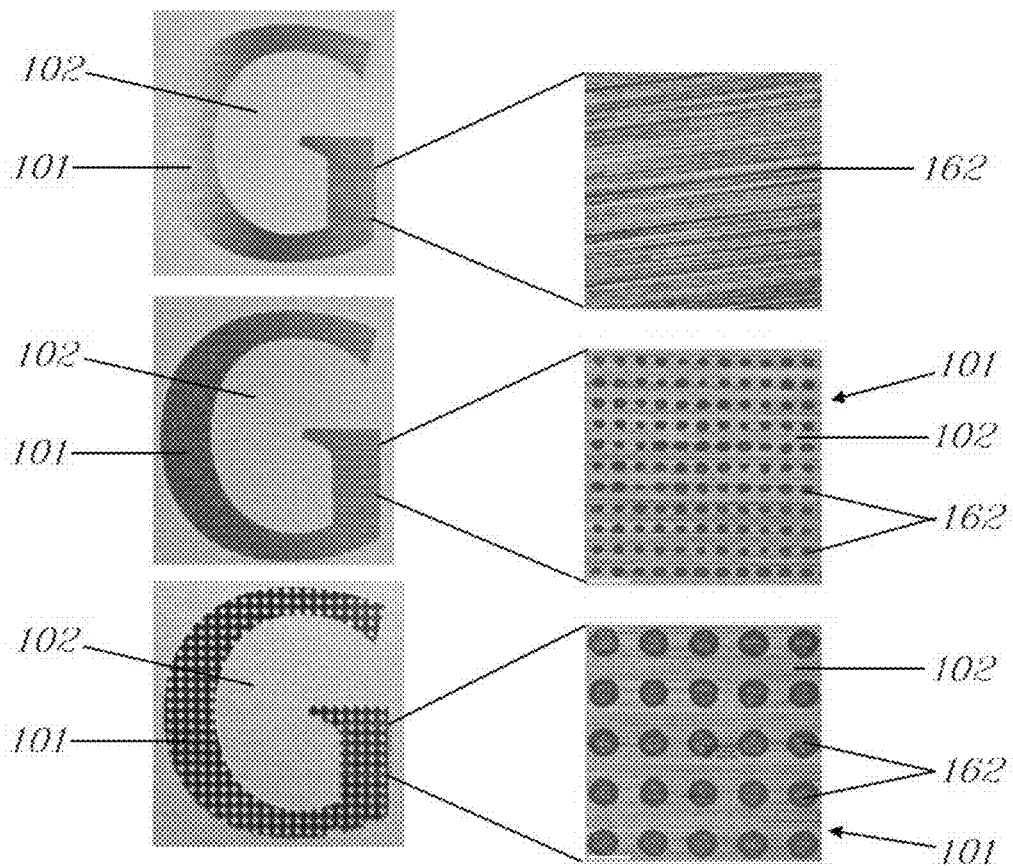
FIG. 13 depicts diagrams showing etched stainless steel according to exemplary embodiments of the present invention.

FIG. 1 is a flowchart of a method of etching PVD-coated stainless steel according to an exemplary embodiment of the present invention; FIG. 2 and FIG. 3 depict diagrams showing a machining step of the present invention; FIG. 4 is a diagram showing a surface of a steel member configured with irregularity after undergoing a machining step; FIG. 5 is a diagram showing a coating step of the present invention; FIG. 6 is a diagram showing that a coating layer is formed on the surface of the steel member, which has undergone the coating step; FIG. 7, FIG. 8 and FIG. 9 depict diagrams showing a masking step of the present invention; FIG. 10, FIG. 11 and FIG. 12 depict diagrams showing an etching step of the present invention; and FIG. 13 depicts diagrams showing etched stainless steel according to exemplary embodiments of the present invention.

As shown in FIGS. 1 to 13, the etching method according to an exemplary embodiment of the present invention roughly includes machining step S100, coating step S200, masking step S300, and etching step S400.

At the machining step S100, a surface of a steel member 100 is machined to form irregularities 140 having predetermined depth and width. At the coating step S200, crests 141 on the surface of the steel member 100 provided with the irregularities 140 are provided with a coating layer 150. At the masking step S300, the surface of the steel member 100 includes a masking area 102 and an exposed area 101. At the etching step S400, the exposed area 101 of the steel member 100 is etched to remove the coating layer 150 formed on the exposed area 101. Hereinafter, each step will be described in detail.

As shown in FIG. 2, FIG. 3 and FIG. 4, at the machining step S100, to form the predetermined irregularities 140 on the surface of the steel member 100, the surface of the steel member 100 is abraded with an abrasive paper 210, or the steel member 100 is passed between embossing rolls 220 provided with embossments having a predetermined shape such that the embossments are transferred on the surface of the steel member 100.

At the present point, for example, abrasives having a size of No. 3, No. 4, and HL based on bonded abrasives grain size (KS L 6001) may be used for abrasives bonded to the abrasive paper 210.

In addition to the means described above, various means may be used to perform hairline machining or to blast the surface of the steel member 100 with abrasives to form the irregularities 140 on the surface of the steel member 100.

An interval between two adjacent crests 141 in the irregularities 140 is defined as a width 144 of the irregularities 140 and a difference in thickness between adjacent crests 141 and throughs 142 is defined as a height 143 of the irregularities 140. In the instant case, the width 144 of the irregularities 140 range from 5 μm to 100 μm, and the height 143 of the irregularities 140 range from 5 μm to 100 μm.

If the width 144 and the height 143 of the irregularities 140 are out of the above ranges, the coating layer 150 may be formed over the entire surface of the steel member 100 without selecting the crests 141 and the throughs 142 in the coating step S200 which will be described later.

As shown in FIG. 5 and FIG. 6, at the coating step S200, the crests 141 of the irregularities 140 including the crests 141 and the throughs 142 are provided with the coating layer 150 having predetermined color and texture. To realize such color and texture, various materials may be used for a coating material forming the coating layer 150, for example, TiC, TiCN, TiN, and TiAlN.

Various methods may be used to form the coating layer 150 on the surface of the steel member 100, but it is preferable to use PVD coating method in which a coating material is attached to the surface of the steel member 100 by a sputterer 320.

The reason for using a PVD coating method is that electric charges 151 are concentrated on the crests 141 due to the shape of the crests 141 among the irregularities 140 of the steel member 100 such that the electric charges 151 concentrated on the crests 141 induce the coating material sputtered at the sputterer 320 to adhere to the crests 141 intensively, whereby the coating layer 150 may be concentrated only on the crests 141 among the irregularities 140.

Furthermore, the method is advantageous for mass production because when a strip form of the steel member 100 that moves from an unwinding coil 310 to a winding coil 340 rotates by a deposition roll 330, the coating layer 150 may be formed in continuous and uniform manner by use of the sputterer 320. Furthermore, the steel member 100 may be applied to various fields because various forms of components may be manufactured by cutting the strip form of the steel member 100 configured with the coating layer 150 in a desired size and then machining the steel member 100.

A thickness of the coating layer 150 ranges from 0.05 µm to 0.15 µm, the coating layer 150 being formed at the coating step S200. When the thickness of the coating layer 150 is less than 0.05 µm, it is impossible to express a color and a texture by the coating layer 150. On the other hand, when the thickness of the coating layer 150 is greater than 0.15 µm, the coating layer 150 is formed on the throughs 142 as well as the crests 141 of the irregularities 140 provided on the surface of the steel member 100 whereby it is difficult to etch the steel member 100 at the etching step S400, which will be described later.

As shown in FIG. 7, FIG. 8 and FIG. 9, at the masking step S300, a photosensitive film 120 is attached on the surface of the steel member 100 and the photosensitive film 120 is irradiated with ultraviolet light 131 through a mask 130 to partially remove the photosensitive film 120 such that the surface of the steel member 100 includes the masking area 102 where a masking layer 121 formed by the remaining photosensitive film 120 is formed and the exposed area 101 where the surface of the steel member 100 is exposed by the removed photosensitive film 120.

As shown in FIG. 7, FIG. 8 and FIGS. 9 and 13, as will be described in more detail below, when the exposed area 101 is formed, the exposed area 101 may be configured as a single hole 162 to have a predetermined shape such as a depth, or the exposed area 101 may be configured as a plurality of holes 162 to have a predetermined shape such as a depth while being disposed on the masking area 102 at regular intervals. Accordingly, it is possible to express the color and texture of the steel member 100 in various ways without changing the material.

As shown in FIGS. 7 to 12, at the etching step S400, the coating layer 150 of the exposed area 101 is removed by etching.

Etching is started from the throughs 142 of the irregularities 140 of the steel member 100, which has no coating layer 150, such that an etched portion 161 is gradually enlarged. As such, the etched portion 161 is enlarged to the crests 141 of the irregularities 140 such that the coating layer 150 provided on the crests 141 of the irregularities 140 of the exposed area 101 is removed.

As an example, the coating layer 150 may include a ceramic such as TiC, and a ceramic is configured as a protection that does not corrode by a FeCl₃ solution used to etch stainless steel.

In the case that the coating layer 150 is formed on the surface of the steel member 100 uniformly, it is impossible to etch the surface of the steel member 100 partially in a selective manner to vary a surface texture. Therefore, through the machining step S100 and the coating step S200, the irregularities 140 are formed on the surface of the steel member 100 and the coating layer is formed only on the crests 141 of the irregularities 140. Thus, the surface of the steel member 100 is exposed at the throughs 142, facilitating etching of the steel member 100.

At the etching step S400, the surface of the steel member 100 may be configured with the hole 162 having a predetermined depth or may be configured with a through-hole 163 penetrating through the steel member 100 in the thickness direction thereof. Such a configuration may be adjusted by a concentration of an etching solution, time for etching, a thickness of the steel member 100, and the like.

The depth of the hole 162 is equal to or greater than 100 µm. Otherwise, the crests 141 of the irregularities 140 on the steel member 100 may not be properly etched and the coating layer 150 may remain.

Accordingly, in the case using the etching method according to an exemplary embodiment of the present invention, individual components are manufactured after the coating layer 150 for imparting color and texture is formed on the surface of the steel member 100, and then, the surface of the steel member 100 is partially etched to display different textures, whereby it is advantageous for mass production, and design, color, and texture may be selected freely.

Hereinafter, embodiments of the present invention will be described in which the surface texture of the etched steel member 100 may be adjusted.

As shown in FIG. 7, FIG. 8, FIG. 9, FIG. 10, FIG. 11, FIG. 12, and FIG. 13, at the masking step S300, when the masking layer 121 is formed on the surface of the steel member 100 to set an etching range for the etching step S400, the exposed area 101 may be configured by various methods as follows.

1) Configuring an Exposed Area Having a Predetermined Area with One Etching Groove As shown in FIGS. 7 to 12 and 13A, the surface of the steel member 100 includes the masking area 102 in which the coating layer 150 remains and the exposed area 101 in which the coating layer 150 is totally removed and thus the hole 162 is configured.

By etching the entire surface of the exposed area 101 to configure the hole 162, the difference in texture between the exposed area 101 and the masking area 102 is maximized.

2) Configuring an Exposed Area by Arranging a Plurality of Holes

As shown in FIGS. 6 to 12, 13B, and 13C, the plurality of holes 162 may be disposed in a predetermined interval to configure the exposed area 101 having a predetermined shape. That is, as the holes 162 configured in a same size on the masking area 102 are disposed in a predetermined interval, a texture middle of the masking area 102 and the exposed area 101 may be expressed.

Here, the shape of the holes 162 may be various shapes such as a circle, an ellipse, a polygon, etc. Furthermore, as the holes 162 vary in size, that is, varies in average diameter, a texture of the exposed area 101 and a texture of the masking area 102 are blended such that various textures are expressed.

The holes 162 shown in FIG. 13B are a circle shape having a diameter of 0.1 mm, and the holes 162 shown in FIG. 13C are a circle shape having a diameter of 0.3 mm. When forming each of the holes 162 to have a small diameter as shown in FIG. 13B, it is possible to exhibit a texture similar to the etching for the predetermined area, and exhibit a relatively high-quality and almost matte texture. Furthermore, when forming each of the holes 162 to have a large diameter as shown in FIG. 13C, it is possible to impart the same texture as printed matters to the exposed area 101.

Accordingly, as each of the holes 162 is adjusted to vary the diameter thereof, it is possible to display a different texture compared to simply etching the entire surface. Here, the each of the holes 162 has a diameter of 0.1 mm to 0.3 mm. When the diameter of each of the holes 162 is less than 0.1 mm, it is difficult to form the masking layer 121 at the masking step S300. Furthermore, when the diameter of each of the holes 162 is greater than 0.3 mm, it is impossible to form the surface of the predetermined exposed area 101 by the arrangement of the holes 162.

Although an exemplary embodiment of the present invention has been described with reference to the accompanying drawings, those skilled in the art will appreciate that various modifications, additions and substitutions are possible, without departing from the scope and spirit of the present invention.

For convenience in explanation and accurate definition in the appended claims, the terms "upper", "lower", "inner", "outer", "up", "down", "upper", "lower", "upwards", "downwards", "front", "rear", "back", "inside", "outside", "inwardly", "outwardly", "internal", "external", "inner", "outer", "forwards", and "backwards" are used to describe features of the exemplary embodiments with reference to the positions of such features as displayed in the figures.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. The exemplary embodiments were chosen and described to explain certain principles of the invention and their practical application, to enable others skilled in the art to make and utilize various exemplary embodiments of the present invention, as well as various alternatives and modifications thereof. It is intended that the scope of the invention be defined by the Claims appended hereto and their equivalents.

What is claimed is:

1. A method of etching physical vapor deposition (PVD)-coated stainless steel, the method comprising:
   machining a steel member to form irregularities on a surface of the steel member;
   coating the steel member by providing a coating layer on crests of the irregularities but not on throughs of the irregularities, the coating layer imparting color and texture to the steel member;
   masking the steel member, wherein the surface of the steel member is partially provided with a masking layer and the surface of the steel member includes a masking area and an exposed area; and
   etching the coating layer provided on the exposed area to remove the coating layer, wherein the etching is started from the throughs of the irregularities to the crests of the irregularities to corrode the coating layer such that the coating layer provided on the crests of the irregularities is removed.

2. The method of claim 1, wherein the coating layer provided at the coating is 0.05 μm to 0.15 μm in thickness.

3. The method of claim 1, wherein, at the coating of the steel member, the crests where electric charges are concentrated on the irregularities are deposited with the coating layer by use of the PVD.

4. The method of claim 1, wherein, at the masking of the steel member, a photosensitive film is attached on the surface of the steel member and a predetermined area of the photosensitive film is irradiated with ultraviolet light to remove the photosensitive film at a position corresponding to the exposed area.

5. The method of claim 1, wherein, at the machining of the steel member, the irregularities are formed on the surface of the steel member, the irregularities ranging from 5 μm to 100 μm in depth and ranging from 5 μm to 100 μm in width.

6. The method of claim 1, wherein, after the etching of the coating layer, the surface of the steel member is configured with a hole in which a depth of the hole is equal to or greater than 100 μm.

7. The method of claim 1, wherein, at the masking of the steel member, a hole has a predetermined area in a continuous manner to give the exposed area a predetermined shape.

8. The method of claim 1, wherein, after the etching of the coating layer, the steel member is configured with a through-hole penetrating through the steel member in a thickness direction of the steel member.

9. The method of claim 1, wherein, at the masking of the steel member, a plurality of holes configured in a same size is disposed in a predetermined interval with adjacent holes of the plurality of holes to give the exposed area a predetermined shape.

10. The method of claim 9, wherein, at the masking of the steel member, the plurality of holes is configured in a circle having a diameter of 0.1 mm to 0.3 mm.

11. The method of claim 1, wherein, at the machining of the steel member, the surface of the steel member is abraded with abrasives to form the irregularity on the surface of the steel member.

12. The method of claim 11, wherein, at the coating of the steel member, the steel member is coated in a roll-to-roll PVD manner.

13. The method of claim 1, wherein, at the machining of the steel member, the steel member is passed between rolls in which each surface of the rolls is configured with embossments to form the irregularity on the surface of the steel member.

14. The method of claim 13, wherein, at the coating of the steel member, the steel member is coated in a roll-to-roll PVD manner.

15. The method of claim 1, wherein a coating material for forming the coating layer includes TiC, TiCN, TiN, or TiAlN.

16. The method of claim 15, wherein the coating material is sputtered by a sputterer onto the surface of the steel member.

* * * * *